United States Patent [19]
Morimoto

[11] Patent Number: 4,749,952
[45] Date of Patent: Jun. 7, 1988

[54] LIGHT AMPLIFIER BASED ON THE MAGNETOELECTRIC-PHOTO EFFECT

[75] Inventor: Takeshi Morimoto, Kyoto, Japan

[73] Assignee: Kyoto University, Kyoto, Japan

[21] Appl. No.: 914,516

[22] Filed: Oct. 2, 1986

Related U.S. Application Data

[63] Continuation of Ser. No. 631,385, Jul. 16, 1984, abandoned.

[30] Foreign Application Priority Data

Jul. 16, 1983 [JP] Japan ................... 58-128708

[51] Int. Cl.$^4$ .................. H01S 3/09; H01S 3/18; G02F 1/39
[52] U.S. Cl. ...................... 330/4.3; 357/17; 372/37
[58] Field of Search .............. 330/4.3; 357/17, 19, 357/27, 30, 61; 372/45, 37

[56] References Cited

U.S. PATENT DOCUMENTS

| 3,247,765 | 4/1966 | Cocca et al. | |
| 4,376,307 | 3/1983 | Rozzi et al. | 372/45 |
| 4,450,460 | 5/1984 | Morimoto | 357/17 |
| 4,516,144 | 5/1985 | Jashalski et al. | 357/27 |

FOREIGN PATENT DOCUMENTS

| 0048079 | 12/1978 | Japan | 372/37 |
| 0116187 | 9/1979 | Japan | 372/37 |
| 2087644 | 5/1982 | United Kingdom | |

OTHER PUBLICATIONS

Morimoto et al., "Infrared Emission . . . in InSb", 9/82, Proc. Int. Symp.; Abst. only supplied.
Morimoto et al., "Addendum on . . . Fields", 5/9/83, pp. 343-344, Phys. Lett. A, vol. 95A, #6;Abst. only.
Morimoto et al., "Infrared Emission . . . Fields", 10/12/81, Phys. Lett. A, vol. 85A, pp. 395-398; Abst. only.
Phelan et al., "Infrared InSb . . . Magnetic Fields", 11/1/63, pp. 143-145, APL, vol. 3, #9.
Gonda et al. "Possibility of . . . Magnetic Field", 1973, pp. 7-16, Bull. Electro. Lab., vol. 37, #7.
Birzhis et al., "Theory of . . . Magnetic Field", 7/74, Sov. J. Quant. Electron., vol. 4, #1.

Primary Examiner—Nelson Moskowitz
Attorney, Agent, or Firm—Fleit, Jacobson, Cohn & Price

[57] ABSTRACT

An anomalous intensification of the infrared emission from n-InSb having a central wavelength almost equal to the energy gap has been observed, as a result of the cooperation of the magnetoconcentration effect and the photo-excitation, in the temperature range from 80° to 300° K. This suggests that a light amplifier which operates at room temperature can be realized through the process for photons with a wavelength corresponding to the energy gap of the semiconductor material forming the light amplifier concerned. Also the cooperation of the magneto-concentration with the photo-excitation has another useful application as a tunable light source controlled by varying the applied magnetic field through the interband Landau-level transitions at liquid helium temperatures.

7 Claims, 7 Drawing Sheets

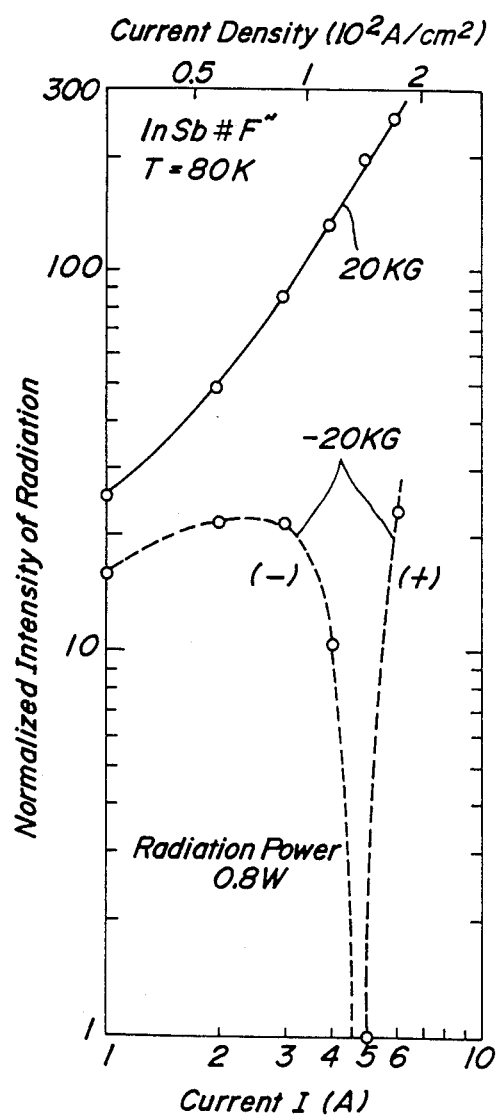

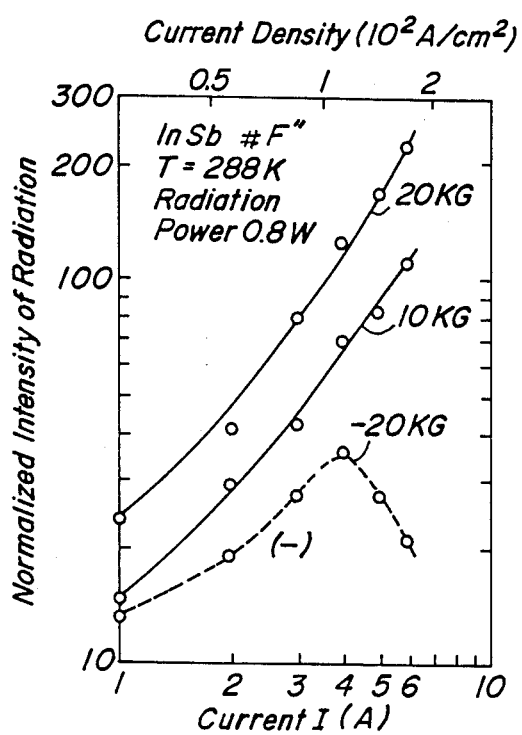

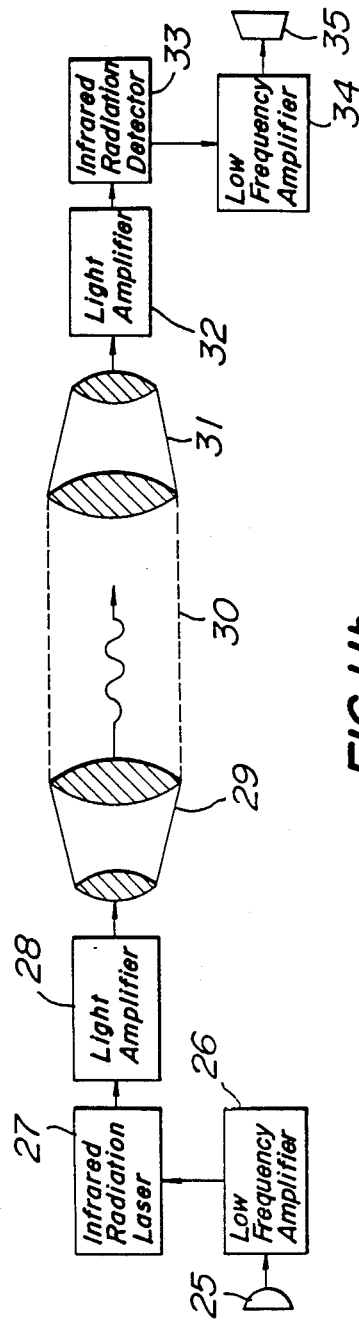
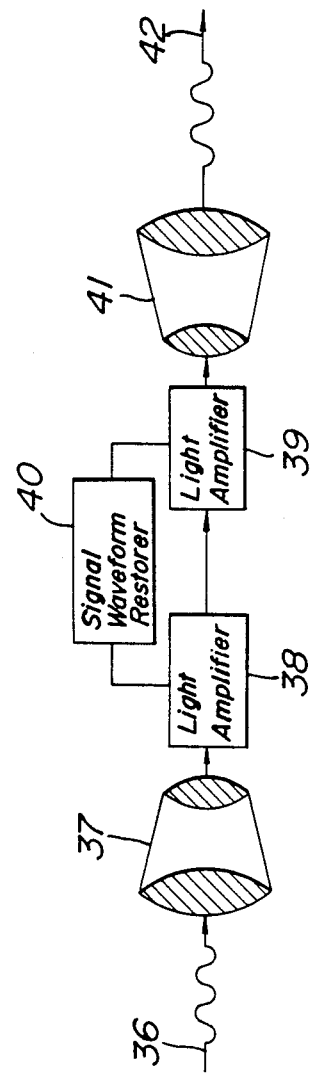
FIG.11a
FIG.11b

LIGHT AMPLIFIER BASED ON THE MAGNETOELECTRIC-PHOTO EFFECT

This application is a continuation of application Ser. No. 631,385, filed July 16, 1984, now abandoned.

BACKGROUND OF THE INVENTION (1) Field of the Invention

The present invention relates to a light amplifier formed of a semiconductor material provided with the faculty of light amplification based on the magnetoelectric-photo effect, particularly, at the room temperature, as well as over a wide range of wavelength at low temperatures such as liquid helium temperature.

(2) Description of the Prior Art

As for the conventional solid-state light amplifier, a light amplifier according to the principle that the light amplification is effected by the stimulated emission from the activated amplifying medium, such as a light amplifier consisting of a semiconductor material in which a population inversion region of electrons and holes is formed on the basis of light pumping effected by a gas laser, a solid-state laser and the like, and a light amplifier consisting of a p-n junction semiconductor material having a population inversion region of electrons and holes in the central portion of the junction region applied with the foward current, has been employed.

It is required for the conventional light amplifier according to the above mentioned principle of light amplification to miniaturize the device, as well as to improve the efficiency of light amplification on the application thereof to the infrared radiation equipment for the optical communication use and for the military industry use.

However, for instance, in the conventional p-n junction type semiconductor laser diode, the width of active region is restricted so narrow as the diffusion length of the carrier, for instance, in the order of 10 $\mu$m. That is, in a p-n junction type laser diode as shown in FIG. 1, a p-n junction region 3 arranged between an n-type semiconductor substrate 1 and a p-type semiconductor layer 2 is applied with a bias voltage through lead wires 6 and 7, and, in this situation, an input light through an end surface 4 polished into a mirror surface is intensified and taken out of an opposite surface 5 as a laser beam 8. However, the width of the p-n junctions 3 appearing on the input surface 4 is extremely narrow as mentioned above, so that it is very difficult to get the input light coupled with the extremely narrow end surface of the p-n junction region 3. In addition, it is required for the operation in the infrared range to refrigerate the device down to the liquid nitrogen temperature, that is, 77° K. or to temperature lower than 77° K., because of the difficulty in forming the effective p-n junction for narrow-gap semiconductors, such as InSb, $Hg_{1-x}Cd_xTe$ and $Pb_{1-x}Sn_xTe$.

In short, the conventional semiconductor light amplifier utilizing p-n junction has the serious defect of inconvenience in practical use. As stated earlier with respect to lasers with p-n junctions, it should be noted that the inverted population of electrons and holes needed for lasing of the laser diode is caused by the injection of excess carriers through the p-n junction and hence by the forward current passing through the junction.

In short, the conventional semiconductor light amplifier has the serious defect of inconvenience in practical use.

SUMMARY OF THE INVENTION

The object of the present invention is to remove the above mentioned defect from the conventional semiconductor light amplifier and to provide a semiconductor light amplifier based on a new principle of the light amplification through the magnetoelectric-photo effect, which can be operated at room temperature for wavelengths longer than ~2 $\mu$m and makes it possible to change the wavelength of the output light as well as having wide area of the surface for the incident light.

The accomplishment of the object would bring remarkable merits in practical use, such that the inconvenience in practical use, due to the use of bulky dewar as well as the use of refrigerant such as liquid nitrogen for refrigirating the device, can be solved and hence the device can be miniaturized, in addition, the coupling of the input light with the active region thereof can easily be achieved over the wide range of wavelength.

The light amplifier using the magnetoelectric-photo effect according to the present invention is based on a new principle quite different from the conventional principle of light amplification that a population inversion region is formed by supplying a large forward current through a p-n junction type semiconductor material, and, as a result thereof, a solid-state light amplifier which can be operated over the wide range of temperature from the liquid helium temperature of 4.2° K. to room temperature as well as over the wide range of wavelength from far infrared to vacuum-ultraviolet, can be realized.

That is, the light amplifier according to present invention is featured in that a semiconductor block consisting of material, having the mobility of electrons and holes corresponding at least to the magnetic-field intensity, is disposed in the magnetic field having the field intensity concerned, that is generated by a permanent magnet or an electromagnet, and a population inversion region of electrons and holes is formed along a surface crossing mutually opposed surfaces in the semiconductor block through a cooperation with the internal or external photo-excitation and the excitation due to the Lorentz force generated by supplying an electric current through electrodes provided on the mutually opposed surfaces respectively, and, as a result thereof, the light which is incident from an opposite surface to the crossing surface and passes through the population inversion region of electrons and holes is amplified and emitted from the crossing surface.

Consequently, in the light amplifier according to the present invention, the conventional inconveniences in practical use have not been dissolved, but, for instance, on the operation at liquid helium temperature, it is also capable of getting an intensified output light having arbitrary wavelength over its wide range corresponding to the intensity of the applied magnetic field. So that various excellent functions and effects, such that the light amplifier according to the present invention can be applicable to the light intensifier, the semiconductor laser of tunable wavelength and the like, can be obtained.

BRIEF DESCRIPTION OF THE DRAWINGS

For the better understanding of the invention, reference is made to the accompanying drawings, in which:

FIGS. 8 to 10 are graphs showing the experimental results of operational performance of the same respectively; and FIGS. 11(a) and (b) are block diagrams showing examples of the configuration of an infrared communication system employing the same.

1 ... n-type semiconductor substrate, 2 ... p-type semiconductor layer, 3 ... p-n junction layer, 4, 5 ... end suface, 6, 7 ... lead wire for applying a bias voltage, 8 ... laser beam, 9 ... semiconductor flat plate, 10 ... light-emitting flat surface, 11 ... light emitted by recombination, 12 ... permanent magnet (electromagnet), 12a ... transparent aperture, 13 ... semiconductor flat plate, 14 ... power source, 15 ... InSb semiconductor sample, 16 ... sapphire window, 17 ... Ge window, 18 ... Ar+ laser, 19 ... chopper, 20 ... light pipe, 21 ... InSb infrared radiation detector, 22 ... lock-in amplifier, 23 ... cathode-ray oscilloscope, 24 ... pulse generator, 25 ... microphone 26, 34 ... low frequency amplifier, 27 ... magneto-infrared diode laser, 28, 32, 38, 39 ... light amplifier using magnetoelectric-photo effect, 29, 31, 37, 41 ... optical system, 30, 36, 42 ... optical signal transmitting medium, 33 ... infrared radiation detector, 35 ... speaker, 40 ... signal waveform restorer.

DESCRIPTION OF THE PREFERRED EMBODIMENTS

First of all, all new principle of light amplification through the magnetoelectric-photo effect used in the light amplifier according to the present invention will be described.

Figure 1:
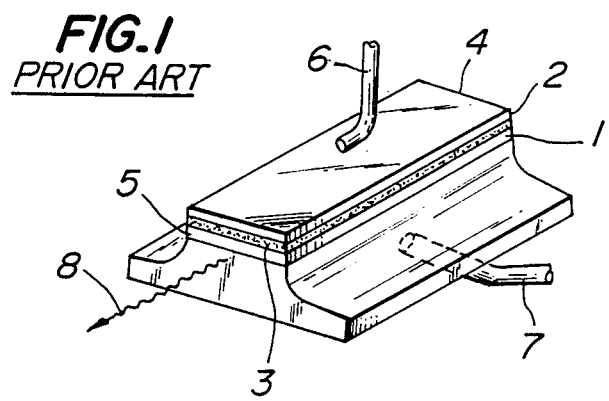
FIG. 1 is a perspective view showing the structure of the conventional p-n junction type semiconductor laser.
Figure 2:
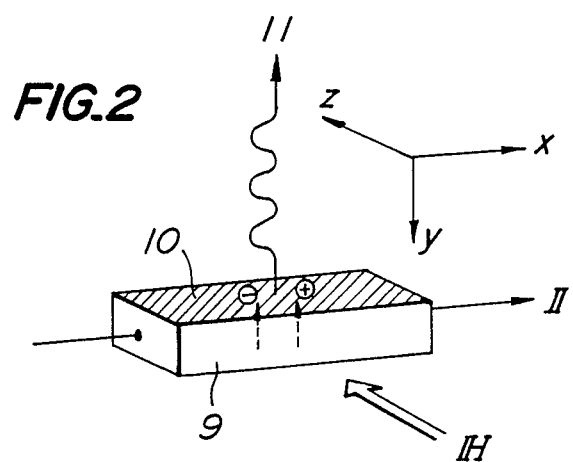
FIG. 2 is a perspective view showing the operational principle of a light amplifier using the magnetoelectric-photo effect according to the present invention.

As shown in FIG. 2, a semiconductor flat plate 9 of a thickness d having $n_0$ electrons and $p_0$ holes per unit volume in thermal equilibrium state is supplied with a current II in the longitudinal direction parallel with X-axis thereof, as well as applied with a magnetic field of intensity H in the transversal direction parallel with Z-axis thereof. In this situation where the magnetic field intensity $H_1$ is so high as the condition of intense magnetic field is satisfied, electrons $\ominus$ and holes $\oplus$ are swept together, as shown by dashed lines in FIG. 2, in $-y$ direction by the Lorentz force based on the cooperation of the magnetic field $H_1$ and the current II.

Figure 3:
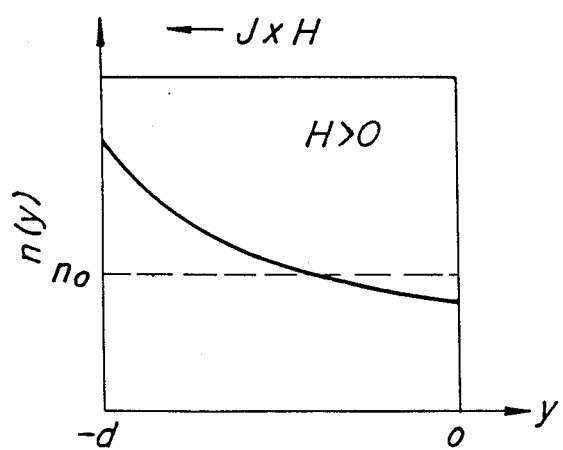
FIG. 3 is a graph showing an example of the operational behaviour of the same.

As a result of the above, the concentration of electrons is deviated, as shown in FIG. 3, from the value $n_0$ in thermal equilibrium state, and will be increased in the vicinity of the light-emitting surface ($y=-d$) shown by shading in FIG. 2, while in the vicinity of the opposite surface ($y=0$) of the sample the concentration is decreased and the depletion region will be left over in the simple case having no internal feed-back of the emission as set forth below. The similar population will be realized for the hole concentration p(y). Consequently, the product np of the concentrations of electrons and holes is expressed by the following expression (1) in the vicinity of the light-emitting surface, resulting in so-called population inversion, when the carriers are degenerated strongly enough $$np > n_i^2, \quad (1)$$

where, $n_i$ is the concentration of intrinsic carriers. In thermal equilibrium state without the application of magnetic field the relation, $n_0 p_0 = n_i^2$, holds.

Accordingly, in the situation where the population inversion is realized as mentioned above, the excess electron-hole pairs are to be annihilated by the recombination therebetween in the vicinity of the light-emitting surface. On this annihilation of the excess pairs, a light 11, having a central wavelength $\sim \lambda_0$ substantially corresponding to the energy gap Eg of the semiconductor material employed, and hence expressed by the following expression (2), is emitted;

$$\lambda_0 \simeq c \cdot h/(Eg+kT), \quad (2)$$

where c is the light velocity, h is Planck's constant, k is Boltzmann constant, and T is the absolute temperature.

The emitted intensity of the above mentioned light having the central wavelength $\lambda_0$ depends non-linearly on the supplied current density J and the applied magnetic field intensity H; the emitted intensity is proportional to the rate $R_c$ of the radiative recombination per unit volume and per unit time in non-equilibrium state, which is expressed by the following expression (3);

$$R_c \simeq R \exp(\gamma JH/kT) \quad (3)$$

with $$R = B n_i^2, \quad (4)$$

where, R and B are the rate and the probability of radiative recombination in thermal equilibrium respectively, $n_i$ is the intrinsic carrier concentration as mentioned earlier, and $\gamma$ is a parameter approximated by the following expression (5) related to the thickness d of the semiconductor flat plate.

$$\gamma \simeq |d|/c \cdot n_0 \quad (5)$$

where $n_0$ is the electron concentration of the semiconductor material.

As described later, the volume recombination of excess electron-hole pairs just below the light emitting surface acts the important role for the process of light amplification. On the accurate evaluation of the rate of the volume recombination, instead of the approximate form of eq. (5), a more accurate expression for $\gamma$ as given by $$\gamma = |d|/cn_0 \quad (6)$$

should be in eq. (3), now being considered to be valid at position y in the inverted population region of the material.

Figure 4:
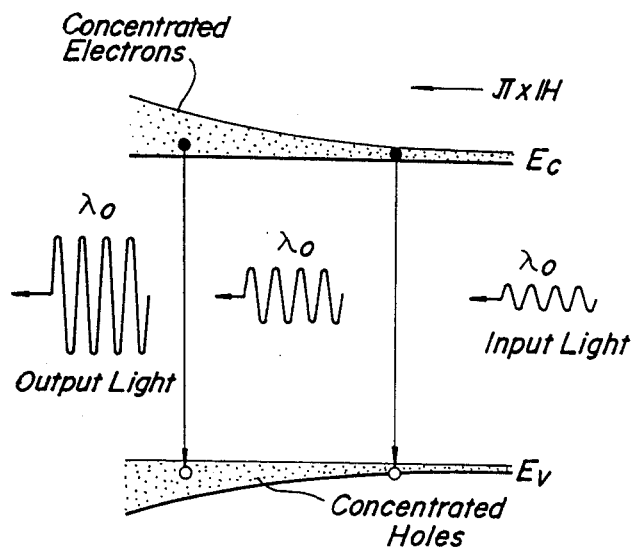
FIG. 4 is a schematic diagram showing the operational principle of light amplification of the same.

The population of electrons and holes in a situation where the above mentioned population inversion is caused over the whole range of y by the J×H force, that is, the Lorentz force acting along the $-y$ direction is schematically shown in one dimension like along the y direction in FIG. 4. It has been clarified from the experiment carried out by the inventor that the depletion region formed in the vicinity of the rear surface opposite to the light-emitting surface 10 of the semiconductor flat plate 9 as shown in FIG. 2 is compensated by electrons and holes generated by the absorption of the background radiation, as well as the reabsorption of the emission enhanced by the multiple reflections at a pair of flat surfaces 10 so that the population inversion region occupies much wider portion of the semiconductor flat plate than the depletion region and hence the depletion region unfavorable for the light amplification will disappear at the limit of high excitation. In this case, the pair of flat surfaces 10, for instance, fabricated by cleavage play an important role for the feed-back of the emission. FIG. 4 depicts a situation where the quasi-Fermi levels of electrons and holes are thus positioned in the conduction band and the valence band, respectively. Indeed, the above expression (3) for the rate $R_c$ of the radiative recombination in which $n(y)=n_o$ is assumed at $y=0$, is a good approximation for the experimental results. In this situation, the incident light having the wavelength $\lambda_0$ corresponding to the direct energy gap of the semiconductor material concerned is amplified, as shown schematically in FIG. 4, by means of the stimulated emission successively repeated while passage through the population inversion region in the semiconductor plate. This is the principle of the light amplification according to the present invention, which is quite different from the conventional principle based on the carrier injection by use of the p-n junction semiconductor. This new principle of light amplification is extremely effective for the infrared radiation intensifier to be operated at the room temperature. In addition, according to this new principle, when the above intensifier is operated at low temperature of liquid helium, namely, at 4.2° K., the light amplification with variable wavelength can be effected by adjusting the intensity of magnetic field applied thereon, as well as an intense monochromatic light source can be realized.

In the situation where an intense magnetic field is applied to the semiconductor material, the energy levels in conduction band and valency band are separated into discrete Landau levels, and hence the wavelength of the light for allowed transition must satisfy the following expression (7) with regard to a simple parabolic band model neglecting the spin.

$$\hbar\omega = Eg + (l+\tfrac{1}{2})\hbar\omega_{c1} + (l+\tfrac{1}{2})\hbar\omega_{c2}, \qquad (7)$$

where $\omega(=2\pi/\lambda)$ is an angular frequency of the light relating to the inter-band Landau transition, $l(=0, 1, 2, \ldots)$ is the magnetic quantum number, is a constant having the relation $=h/2\pi$ with Planck's constant h, $\omega_{ci}(=eH/m_ic$: $i=1, 2)$ are the cyclotron angular frequencies of electron (for $i=1$) and hole (for $i=2$) respectively, $m_i$ are effective masses of the electron (for $i=1$) and the hole (for $i=2$) respectively, e is the electric charge of the electron, c is the light velocity, and H is the magnetic field intensity.

Accordingly, an intensified emission 11 having a wavelength satisfying the expression (7) can be obtained by irradiating the rear surface ($y=0$) of the semiconductor flat plate 9 with a light having a shorter wavelength in comparison with the energy gap Eg of the semiconductor material concerned, by increasing the polulation inversion of electrons and holes in the vicinity of the light-emitting surface through the co-operation of the photo-excitation of electrons and holes in the applied $J \times H$ force. In addition, as is apparent from the expression (7), it is possible to continuously tune the frequency of the light emitted by recombination 11 by controlling the intensity H of the applied magnetic field, and hence it is also possible to produce a monochromatic light source or a monochromatic laser with adjustable wavelength.

On the other hand, it is possible to realize a monochromatic light source having further shorter wavelength, for instance, a vacuum-ultraviolet light source by employing an electron-beam excitation in place of the photo-excitation. Furthermore, it is also possible to use the above mentioned light source as a semiconductor laser operating in extremely wide range of wavelengths by empolying suitable feedback using an additional resonator.

The light amplifier according to the present invention has not only a valuable kind of practical application thereof. The wavelength of the emission changes corresponding to the energy gap Eg of the used semiconductor materials, as expressed by expression (2) or by expression (7) for the operation at liquid helium temperature. Consequently, it is also possible to amplify the light over the wide range of wavelength from far-infrared to vacuum-ultraviolet.

With respect to various semiconductor material employed for the light amplifier according to the present invention, the relationship between the energy gap Eg and the wavelength $\lambda$ to be amplified is shown as an example in Table 1.

TABLE 1

| Semiconductor material | Composition ratio | Energy gap (ev) | Wavelength $\lambda$ ($\mu$m) |
|---|---|---|---|
| InSb | | 0.23 | 5.3 |
| InAs | | 0.36 | 3.4 |
| $Hg_{1-x}Cd_xTe$ | $0.15 < x \leq 0.5$ | | |
| | x = 0.15 | >0 | |
| | x = 0.2 | 0.1 | 12.4 |
| | x = 0.4 | 0.5 | 2.5 |
| | x = 0.5 | 0.6 | 2.1 |
| $Pb_{1-x}Sn_xTe$ | $0 \leq x \leq 1$ | | |
| | x = 0.4 | 0 | |
| | x = 0 | 0.18 | 6.9 |
| | x = 1 | 0.3 | 4.1 |
| $Pb_{1-x}Sn_xSe$ | $0 \leq x \leq 0.5$ | | |
| | x = 0 | 0.26 | 4.8 |
| $Bi_{1-x}Sb_x$ | $0.08 \leq x \leq 0.22$ | | |
| | x = 0.08 | 0 | |
| | x = 0.22 | 0.05 | 24.8 |
| Ge | | 0.67 | 1.85 |
| Si | | 1.11 | 1.12 |
| Ga As | | 1.43 | 0.87 |
| Ga N | | 3.5 | 0.35 |
| In P | | 1.28 | 0.97 |
| $ZnS(\alpha)$ | | 3.8 | 0.33 |

In this connection, as for the light amplifier according to the present invention, all kinds of semiconductor materials can be employed in principle. However, it is preferable, in relation with the intensity of magnetic field required for composing the light amplifier of the present invention, to employ the semiconductor material having high mobilities of electrons and holes, that is, small effective masses $m_i$ of electrons and holes.

Figure 5:
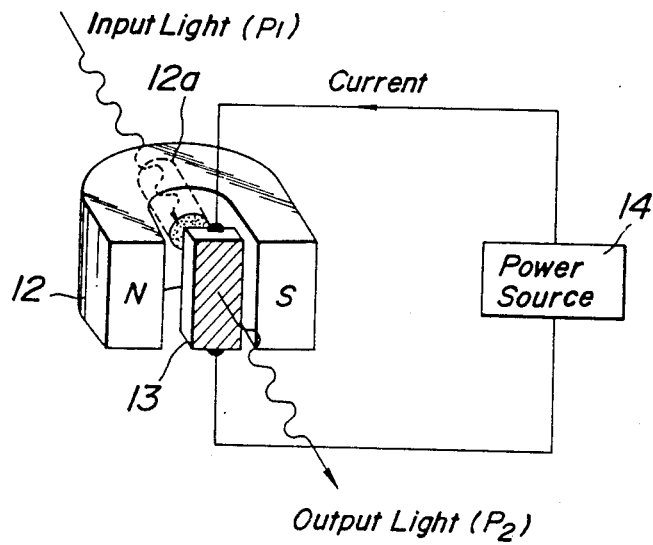
FIG. 5 is a perspective view showing an example of the fundamental configuration of the light amplifier according to the present invention.

A fundamental configuration of the light amplifier of the present invention for effecting the light amplification based on the above detailed operational principle is shown in FIG. 5. In this configuration, a flat plate 13 of semiconductor material as exemplified in Table 1 is disposed between poles N and S of a permanent or electromagnet 12 forming an intense magnetic field over ten thousands gausses. An electric current I in a form of dc, ac or pulse is supplied from an external power source 14 through electrodes deposited respectively on both end surfaces of the semiconductor flat plate 13.

In this connection, the electrodes deposited on both end surfaces of the semiconductor flat plates 13 can be formed of so-called ohmic electrodes simply used for supplying the electric current as well as of semiconductor electrodes acting for both of current supply and injection of minority carriers into the semiconductor material.

When an input light $P_1$ having a wavelength corresponding to the energy gap of the semiconductor material as exemplified in Table 1 is incident upon the rear surface of the semiconductor flat plate 13 composed as mentioned above, for instance, through an aperture 12a formed of transparent material at the central portion of the magnet 12, as shown in FIG. 5, the light amplification based on the foresaid principle is effected in the semiconductor flat plate 13, and hence an amplified output light $P_2$ is emitted from the light emitting surface as shown by shading in FIG. 5. In a situation where at least either one of the intensity H of the applied magnetic field and the intensity I of the supplied current is varied in the wellknown conventional way, the output light $P_2$ can easily be modulated by an external signal. In another situation where the above arrangement is operated at low temperature such as at liquid helium temperature (4.2° K.), when photo-excited carriers are generated in the semiconductor material by irradiating the rear surface of the semiconductor flat plate 13 with the input light $P_1$ having a wavelength shorter than that corresponding to the energy gap of the semiconductor material and the current is passed through the electrodes under the application of magnetic field having an intensity varying from ten thousands to one hundred and fifty thousands gausses, for instance, by use of a super-conductive electromagnet, an intense monochromatic light having a variable wavelengths corresponding to the varied intensities of the applied magnetic field can be emitted from the light emitting surface according to the operational principle expressed by the aforesaid expression (7). The range of wavelength variation of the output light emitted, for instance, when an InSb flat plate is subjected to the magnetic field being so intense as one hundred thousands gausses or so, covers from 5.3 to 4.9 $\mu$m.

The light amplifier according to the present invention has not only the feature that it can be operated in the intrinsic region of semiconductor materials under the satisfaction of the aforesaid condition of intense magnetic field, but also generally includes all of the devices which effect the light amplification based on the population inversion of electrons and hoes, formed by the so-called Lorentz force, that is, the J×H force originated from the interaction of the supplied electric current I with the applied magnetic field H, naturally including the aforesaid situation where the condition of the applied magnetic field intensity is mitigated by the injecting minority carriers into the semiconductor flat plate through electrodes attached thereto as mentioned earlier.

Figure 6:
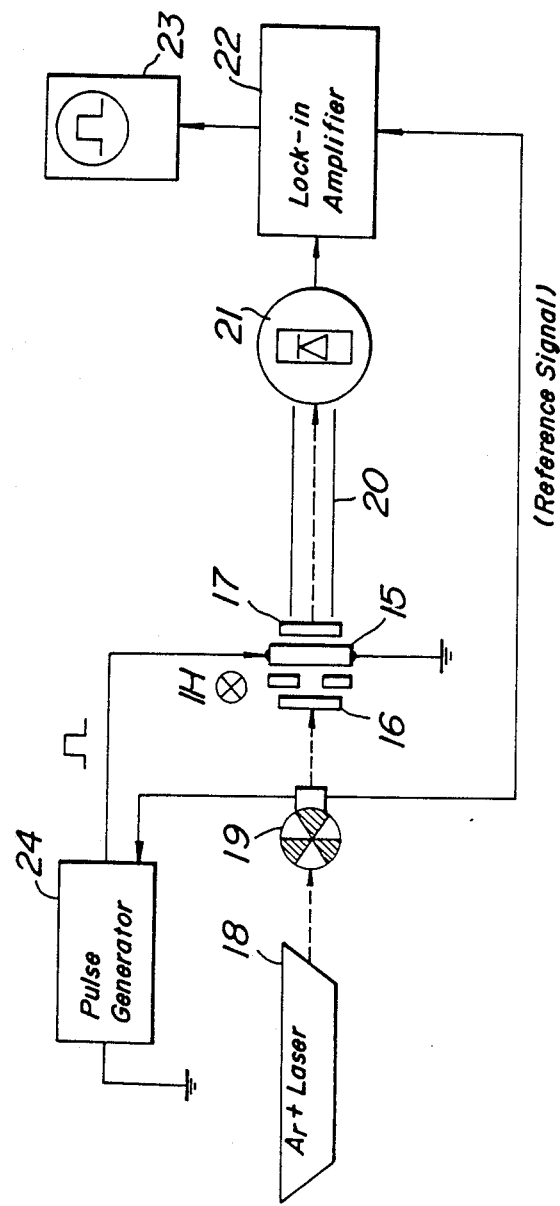
FIG. 6 is a block diagram showing a configuration of an equipment for measuring a pulsed light amplification performance of the same.

Next, the result of the experiment in which the pulse performance of light amplification effected by the light amplifier formed of n-type InSb semiconductor material according to the present invention was measured by the apparatus arranged as shown in FIG. 6 will be described hereinafter.

As the experimental sample, an InSb flat plate 15 with an effective size being 11 mm long, 4.0 mm wide and 0.88 mm thick was employed. This sample has the values of the electron concentration $n_o$ and the Hall mobility $\mu$ being $5 \times 10^{15}$ cm$^{-3}$ and $1.66 \times 10^5$ cm$^2$/Vs respectively at low temperature of 77° K. and being $2.38 \times 10^{16}$ cm$^{-3}$ and $6.41 \times 10^4$ cm$^2$/Vs respectively at room temperature of 294° K. This sample 15 was mounted in a metal dewar having a Ge window 17 of 9 mm effective diameter which works as a 5.3 $\mu$m bandpass filter, and was supplied with a pulsed current having a pulse width of 20 $\mu$s, a repetition rate of 50 Hz and an intensity up to 6 A by a pulse generator 24, as well as with an ac current having an intensity up to 200 mA at a frequency of 250 Hz or a dc current optionally, and further was subjected to a dc magnetic field H having an intensity of 20 K gausses by an electromagnet across the supplied current.

Figure 7:
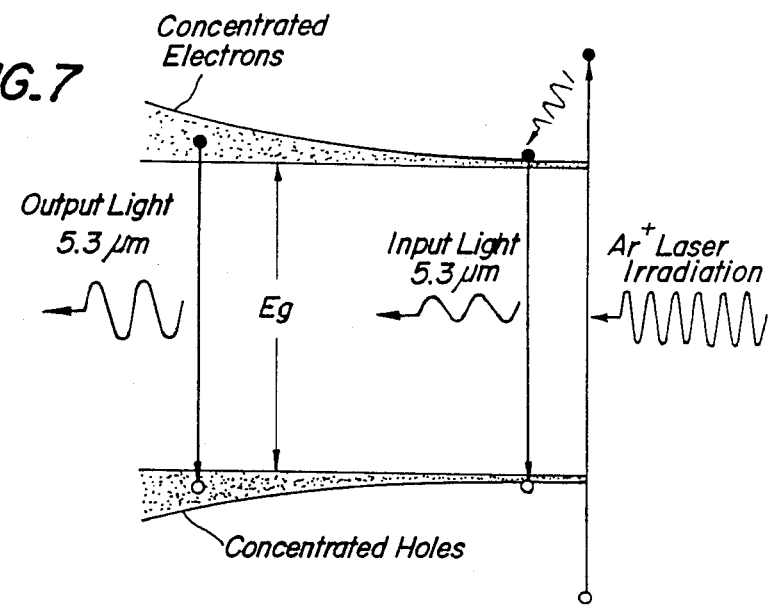
FIG. 7 is a schematic diagram showing an operational behaviour of the same.

As for the input light having the wavelength 5.3 $\mu$m corresponding to the energy gap of the InSb sample 15, an output light of an Ar$^+$ laser 18 cw operated at a wavelength of 514.5 nm with a power from 100 to 900 mW was converted into a rectangular pulsed light of a frequency 50 Hz through a chopper 19 and then the rear surface of the sample 15 was irradiated by the light through a sapphire window 16 and an aperture of 3 mm diameter, so as to generate the required input light of wavelength ~5.3 $\mu$m from the photo-luminescence associated with the above photo-excitation, as shown in FIG. 7.

The amplified output light from the sample 15 was taken out of a Ge window 17 having a maximum transmittance at 5.3 $\mu$m and then fed into an InSb infrared radiation detector 21 mounted in another metal dewar through a light pipe 20 of 50 cm length.

The photosignal from the detector 21 which was modulated at 50 Hz or 250 Hz was synchronously detected by a lock-in amplifier 22. The waveform of the detected output signal derived from the amplifier 22 was indicated on a cathode-ray display 23. In this connection, the InSb infrared detector 21 is a photovoltaic detector, which is operated in a range of wavelength from 2 $\mu$m to 5.7 $\mu$m at the low temperature of 80° K., and has a maximum spectral detectivity $D^* = 1.3 \times 10^{11}$ cm·Hz$^{\frac{1}{2}}$·W$^{-1}$.

Figure 8:
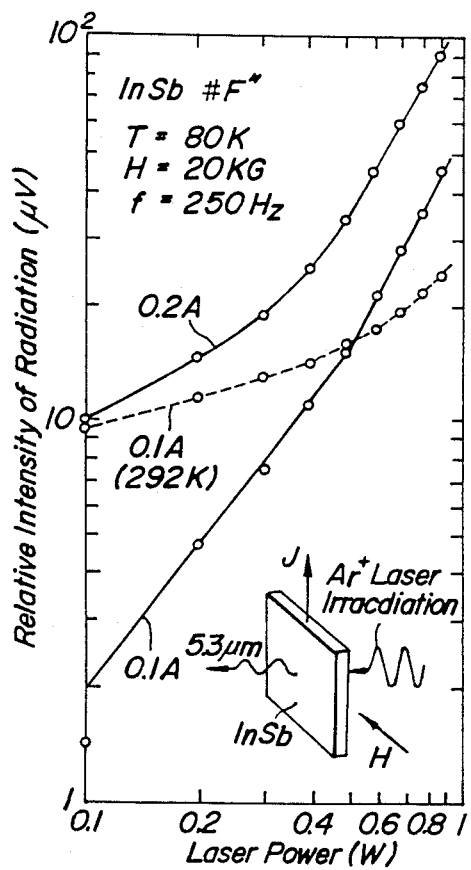

An example of the experimental result of the dependency of the emitted intensity at low temperature of 80° K. and at room temperature of 292° K. on the incident laser power, which was obtained by the above described setup in the situation where the InSb semiconductor sample 15 was supplied with an ac current of 0.1 A or 0.2 A at a frequency of 250 Hz across the magnetic field of 20 K gausses is shown in FIG. 8. In FIG. 8, the solid curves indicate the result measured at 80° K. and the dashed curve indicates that at 292° K.

It is clearly recognized from the above experimental result that the intensity of the radiation emitted from the InSb sample is much increased, when the irradiation power of the exiting laser exceeds 500 mW. In fact, when the irradiation power of the exciting laser is set up at 900 mW, the intensity of the radiation emitted from the InSb sample is really increased by one hundred times of the non-excited case at a low temperature of 80° K., for the current I=0.1 A, and by 3.3 times even at room temperature of 292° K.

The nonlinear dependence of the intensity of the radiation emitted from the semiconductor sample on the irradiation power of the exciting laser as shown above suggests that a stimulated emission takes place through the co-operation of the magneto-concentration effect based on the J×H force, as shown by the solid curve in FIG. 3, and the photo-excitation in the InSb semiconductor material subjected to an intense magnetic field. The fact that such light amplification based on this stimulated emission is actually effected in the semiconductor material subjected to an intense magnetic field can be directly confirmed by the following experiment.

As the confirming experiment, an InSb flat plate in FIG. 8, was irradiated by the chopped Ar+ laser beam of 800 mW at a frequency of 50 Hz, so as to generate the input light having a wavelength of 5.3 μm from the photo-luminescence by the photo-excitation. In the situation, dc pulsed current up to 6 A with 20 μs width was synchronously passed through the sample across the applied magnetic field of 20 K gausses, and the output light from the semiconductor flat plate 15 was synchronously detected by the combination of the narrow band InSb infrared detector 21 and the lock-in amplifier 22 through the 5.3 μm bandpass Ge filter 17.

Thus detected intensity of the output radiation, which is normalized by the intensity of the photo-luminescence in the absence of any applied magnetic field and electric current, is shown in FIGS. 9 and 10. The data measured at low-temperature of 80° K., as shown in FIG. 5, indicate the dependence of the normalized output radiation upon the intensity of the supplied current under the application of the magnetic field of H=20 K gausses and H=−20 K gausses. While, the data as shown in FIG. 10 indicate the similar results measured at room temperature of 292° K. Both these data are corrected, so as to have the same duty ratio, taking into account the difference in the pulse densities, namely, duty ratios between the pulsed current supplied and the chopped laser irradiation.

On the other hand, it has been confirmed from the comparison with the data measured in the situation where in place of the pulsed current a low dc current is supplied to the semiconductor sample with the chopped irradiation that the above normalized intensity of the emitted radiation coincides with the net amplification ratio with the accuracy within a factor of 2. Consequently, the experimental data as shown in FIG. 9 indicate that the light amplification by a factor of about 260 results from the InSb semiconductor sample situated at low temperature of 80° K. with the application of the magnetic field of H=20 K gausses and the electric current of I=6 A. In this connection, when the polarity of the applied magnetic field is reversed, it can be seen as indicated by the dashed curve in FIG. 9 that the negative amplification, namely, the absorption of the background light is effected in the vicinity of the light-emitting surface of the semiconductor sample in the range of the supplied current intensity, I≦4 A. This absorption of the background light results from the fact that, in the situation where H<0, namely, the magnetic field of negative polarity is applied, the excess electron-hole pairs concentrate in the vicinity of the rear surface of the semiconductor flat plate, while the depletion region is formed in the vicinity of the light-emitting surface thereof, and hence the absorption of the background radiation occurs in this depletion region, so as to compensate the decrease of the carrier concentration therein. However, in the range of the supplied current intensity, I≧5 A, it seems that the absorption of the background radiation tends to saturate, and hence the emitted intensity increased in the vicinity of the rear surface thereof inversely overcomes this saturated absorption, and, as a result, the net light amplification is effected again. Moreover, it is also observed in the InSb semiconductor sample situated at room temperature that the light amplification by a factor exceeding 200 is realized with the application of the magnetic field of 20 K gausses and the electric current of 6 A and that the negative amplification, namely, the absorption of the light is caused by the polarity reversal of the applied magnetic field.

The above described experimental results indicates that, when the incident light having the wavelength corresponding to the energy gap of the semiconductor material passes through the population inversion region satisfying the relation $np > n_i^2$, which is realized by the magneto-concentration effect due to the J×H force obtained by the application of the intense magnetic field and the electric current in the semiconductor material, the incident light can be amplified through the successive stimulated emissions in the population inversion region. This establishes a new principle of light amplification in semiconductor materials.

In the light amplifier based on the above new operational principle according to the present invention which is formed of various kinds of semiconductor materials having respectively different energy gaps, for instance, as shown in Table 1, it is posssible to intensity the incident light having wavelength in wide ranges from far infrared to vacuum-ultraviolet, furthermore it is also possible to easily modulate the intensified output light through controlling the current intensity supplied thereto.

In the light amplifier effecting the light amplification in the above mentioned way according to the present invention, the light amplification can be readily attained in the extremely wide range of wavelengths and at the wide range of temperatures from liquid helium temperature to about 100° C. over room temperature, so far as the condition of intense magnetic field is satisfied. In addition, the efficiency of this light amplification can be raised by spreading the population inversion region of electrons and holes in the direction of thickness of the semiconductor flat plate through the suitable surface treatments on the semiconductor material. It is also effective for a certain kind of semiconductor materials to inject the minority carriers thereinto through suitable injection electrodes provided thereon, so as to increase the effect of the application of magnetic field.

In the situation where the light amplifier of the present invention is operated at low temperatures such as liquid helium temperature, the carrier based on the photo-excitation are generated by irradiating the rear surface of the semiconductor flat plate with incident light having a shorter wavelength than that corresponding to the energy gap of the semiconductor material concerned, and the concentration of excess electron-hole pairs in the vicinity of the light-emitting surface thereof can be increased by the action of the J×H force and hence it is possible to control the wavelength of the intensified output light corresponding to the intensity of the applied magnetic field, so as to utilize the light amplifier concerned as a monochromatic light source having a tunable wavelength; furthermore it is possible to utilize it as a laser having a tunable wavelength by attaching an appropriate resonator thereto.

Next, suitable examples of the utilization of the light amplifier based on the electromagnetic-photo effect according to the present invention to the various kinds of photo-communication apparatus will be described hereinafter.

(a) An infrared wireless communication apparatus:

The infrared radiation having a wavelength ranging from 8 to 14 μm can be utilized for the wireless communication in the space or between the ground stations. A transmitting and a receiving light amplifiers are indispensable for these wireless communications. Moreover, special performances such as these light amplifiers are to be operated at room temperature with the large amplification factor and provided with large light-receiving surfaces facilitating the coupling with the incident light is required. As for the light amplifier according to the present invention which can be operated in the above mentioned range of wavelength, for example, a semiconductor material consisting of mercury cadmium telluride $Hg_{1-x}Cd_xTe$ having the composition ratio $x \simeq 0.2$ is provided with the faculty of amplifying the light having a wavelength close to 12.4 μm. This light amplifier can be used as a laser diode by applying suitable feedback thereto, so as to utilize it as a transmitting light source.

The outline of the configuration of this infrared wireless communication apparatus is shown in FIG. 11(a). In this outlined configuration, the magnetoelectric-photo effect according to the present invention is applied to an infrared emitting diode laser 27, so as to emit the infrared radiation at a wavelength of 12.4 μm, and as for the current to be supplied to the diode concerned, the current at audio frequency derived from the microphone 25 and amplified through the low frequency amplifier 26 is employed. As a result, the infrared photosignal which is intensity-modulated by the current at audio frequency can be obtained. This infrared photosignal amplified through the light amplifier 28 according to the present invention is sent into the photo transmission medium 30 through the transmitting optical system 29. This transmitted photosignal is received through the receiving optical system 31 by the light amplifier 32 according to the present invention, and then detected through the infrared radiation detector 33, in order to be converted to the electric signal at audio frequency which is applied to the speaker 34. This demodulated infrared radiation is applied to the speaker 35 through the low frequency amplifier 34, so as to obtain the desired audio output.

(b) A repeater amplifier for the infrared wireless communication:

Generally speaking, when the transmission distance of the photosignal in the photo-communication is elongated, the intensity of the photosignal attenuates, and so it is necessary to repeatedly amplify the attenuated photosignal through the repeater amplifiers arranged at every adequate transmission distances. As for the repeater amplifier, an indirect-type light amplifier, in which the electric signal once converted from the photosignal and power-amplified is reconverted to the photosignal through light-emitting diodes, as conventionally conceived; however the quality of the photosignal such as the amount of information contained therein and the signal to noise ratio is much deteriorated through the conversion process. On the other hand, the light amplifier according to the present invention can be operated at room temperature and has the large amplification factor and the large light-receiving surface facilitating the direct coupling with the incident light, and hence the ideal operation required for the repeater amplifier used for the photo communication can be expected therethrough.

In the configuration of the infrared wireless communication system in which the light amplifier according to the present invention is employed as the repeater amplifier, as exemplified in FIG. 11(b), the photosignal propagating through the photo transmission medium 36 is repeatedly amplified by the light amplifiers 38 and 39 through the receiving optical system 37, as well as the distortion of waveform of the photosignal, which is caused during the transmission, is corrected through the signal waveform restorer 40, and thereafter the amplified and corrected photosignal is transmitted again through the photo transmission medium 42.

(c) An optical fiber communication apparatus:

For instance, in the situation where the light amplifier according to the present invention is employed for the optical fiber communication system using the photo carrier having the wavelength 0.87 μm, the photo transmission medium in the wireless communication system as shown in FIGS. 11(a), (b) is to be replaced with the optical fiber, as well as a gallium arsenide compound GaAs which can operate at the wavelength close to 0.87 μm is to be selected for the semiconductor material forming the light amplifier according to the present invention. In this situation, the arrangements as shown in FIGS. 11(a), (b) can be utilized as the communication apparatus.

As is apparent from the mentioned above, according to the present invention, it is possible to realize a light amplifier, which can operate at room temperature, by applying an intense magnetic field, for instance, by a permanent magnet, to a semiconductor material through which a current is passed. Moreover, it is also possible to realize an intense monochromatic light source, namely, a laser having a tunable wavelength corresponding to the intensity of the magnetic field applied thereon by a superconductive electromagnet, in the situation where the light amplifier concerned is operated at low temperature such as liquid helium temperature with photo-excitation.

The conventional p-n junction type semiconductor laser has a defect such that the area for receiving the incident light is extremely narrow, and hence it is difficult to couple the incident light therewith, in addition it has also the defect that it only can be operated at low temperatures at lower temperature than liquid nitrogen temperature for the generation of medium infrared radiation longer than ~2 μm wavelength.

On the contrary, the light amplifier based on the magnetoelectric-photo effect according to the present invention has numerous remarkable advantages such that it can be operated fundamentally at room temperature, and that the area for receiving the incident light is not only much broader than the conventional one, but it is also possible to obtain a light amplification factor exceeding 200 times per stage. Accordingly, it can be expected that the light amplifier according to the present invention is utilized for the repeater amplifier in the optical communication system employing the optical fiber, or, the light amplifier for the wireless communication using the infrared radiation of wavelength from 8 to 14 μm. In addition, in the situation where it is operated at low temperatures such as liquid helium temperature, it can also be expected that the light amplifier according to the present invention is more effectively utilized as the intense light source generating tunable wavelength of radiation suitable for the wireless communication system than with the conventional spin-flip Raman laser which has been available today. Additionally speaking, the conventional spin-flip Raman laser generates actually the tunable wavelength of radiation corresponding to the intensity of the magnetic field applied at liquid helium temperatures; however, it is operated by using the spin flip Raman effect, and so the power efficiency factor thereof is distinctly smaller than that of the light amplifier according to the present invention.

What is claimed is:

1. A light amplifier for amplifying incident light based on the magnetoelectric-photo effect, comprising:
   a semiconductor block consisting of homogeneous material, having the mobilities of electrons and holes corresponding at least to an intensity of a magnetic field, is disposed in said magnetic field having said intensity which is generated by a permanent magnet or an electromagnet, and
   a population inversion region of electrons and holes is formed in said semiconductor block along a first flat surface crossing mutually opposed surfaces of said semiconductor block by the Lorentz force generated by supplying an electric current across said magnetic field through electrodes provided on said mutually opposed surfaces respectively, as well as extended as a depletion region formed proximate a second flat surface opposite to said first flat surface associated with said population inversion region is removed by internal photo-excitation effected through said second flat surface in conjunction with said first flat surface,
   said incident light impinging upon said second flat surface toward said first flat surface, passing through said population inversion region of electrons and holes is amplified and emitted from said first flat surface.

2. A light amplifier as claimed in claim 1, wherein said electrodes are formed of material for injecting the minority carriers among electrons and holes.

3. A light amplifier as claimed in claim 1, wherein said material is selected from a group consisting of InSb, InAs, $Hg_{1-x}Cd_xTe$, $Pb_{1-x}Sn_xTe$, $Pb_{1-x}Sn_xSe$, $Bi_{1-x}Sb_x$, Ge, Si, GaAs, GaN, InP and $ZnS_{(\alpha)}$.

4. A light amplifier as claimed in claim 1, wherein the wavelength of the light emitted from said crossing surface can be variable corresponding to said intensity of said magnetic field.

5. An optical communication apparatus comprising at least two light amplifiers as claimed in claim 1, wherein one of said light amplifiers is used for amplifying a light to be transmitted and the other of said light amplifiers is used for amplifying a received light.

6. An optical communication apparatus as claimed in claim 5, wherein said at least two light amplifiers consist in a repeater amplifier together with a signal waveform restorer connected between said light amplifiers.

7. A light amplifier for amplifying incident light based on the magnetoelectric-photo effect comprising:
   means for generating a magnetic field having a predetermined intensity;
   a semiconductor block having two mutually opposed surfaces and consisting of homogeneous material having the electron and hole mobilities corresponding to at least said predetermined intensity of said magnetic field;
   means for supplying an electric current across said magnetic field through electrodes provided on said mutually opposed surfaces and for providing a population inversion region of electrons and holes along a first flat surface crossing said mutually opposed surfaces by the Lorentz force due to the crossed magnetic field and the electric current, as well as for extending said population inversion region as a depletion region formed proximate a second flat surface opposite to said first flat surface associated with said population inversion region is removed by internal photo-excitation effected through said second flat surface in conjunction with said first flat surface;
   means for inputting said incident light onto said second flat surface such that said incident light passes through said population inversion region, is amplified and is emitted from said first flat surface.

* * * * *